United States Patent [19]
Yang

[11] Patent Number: 5,429,971
[45] Date of Patent: Jul. 4, 1995

[54] METHOD OF MAKING SINGLE BIT ERASE FLASH EEPROM

[75] Inventor: Ming-Tzong Yang, Hsin Chu, Taiwan

[73] Assignee: United Microelectronics Corporation, Hsinchu, Taiwan

[21] Appl. No.: 317,016

[22] Filed: Oct. 3, 1994

[51] Int. Cl.⁶ .................................... H01L 21/8247
[52] U.S. Cl. .................................... 437/43; 437/48; 437/52
[58] Field of Search .................. 437/43, 48, 52, 200; 257/326

[56] References Cited

U.S. PATENT DOCUMENTS

| | | | |
|---|---|---|---|
| 4,420,871 | 12/1983 | Schiebe | 437/43 |
| 4,950,068 | 7/1990 | Sugaya | 437/43 |
| 5,081,054 | 1/1992 | Wu et al. | 437/52 |

FOREIGN PATENT DOCUMENTS

| | | | |
|---|---|---|---|
| 145080 | 6/1983 | Japan | 257/326 |
| 015073 | 6/1990 | Japan | 437/52 |
| 296365 | 12/1990 | Japan | 437/52 |

*Primary Examiner*—Tom Thomas
*Attorney, Agent, or Firm*—George O. Saile

[57] ABSTRACT

A semiconductor transistor device on a semiconductor substrate comprises source/drain regions in the substrate. A tunnelling oxide layer combined with a gate oxide layer covers the substrate including the heavily doped regions. A pair of floating gates above the tunnelling oxide layer form source/drain relationships with three centrally located ones of the heavily doped regions. A first dielectric layer covers the floating gates. A set of control gates cover the first dielectric layer. A second dielectric layer covers the control gates. The floating gate structure, the first dielectric layer, the control gate layer and the second dielectric layer all forming with the three centrally located heavily doped regions an adjacent pair of stacked EEPROM transistor structures, with two additional, adjacent, outboard heavily doped regions. Spacers cover the tunneling oxide regions covering the second dielectric layer and the sides of the stacked structure, and a select gate line extends over the top of the spacer layer structure and in source/drain relationship with the two additional outboard heavily doped regions and the outer ones of the three centrally located heavily doped regions.

24 Claims, 9 Drawing Sheets

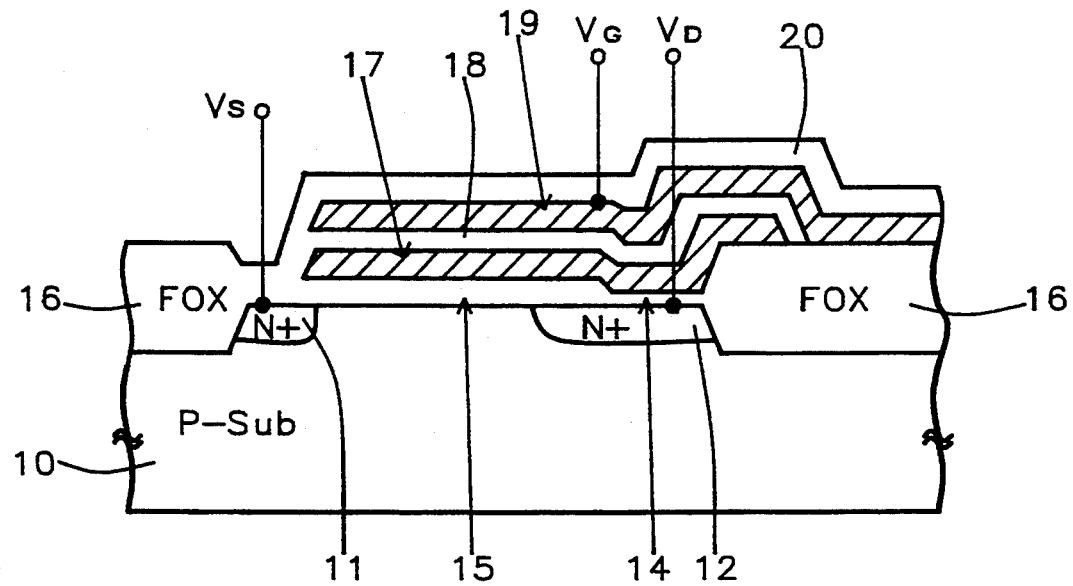
*FIG. 1A - Prior Art*
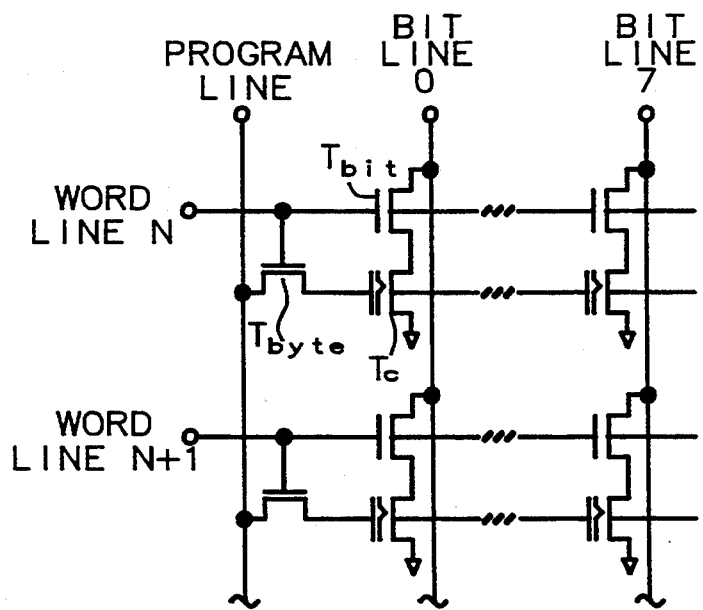
*FIG. 1B - Prior Art*

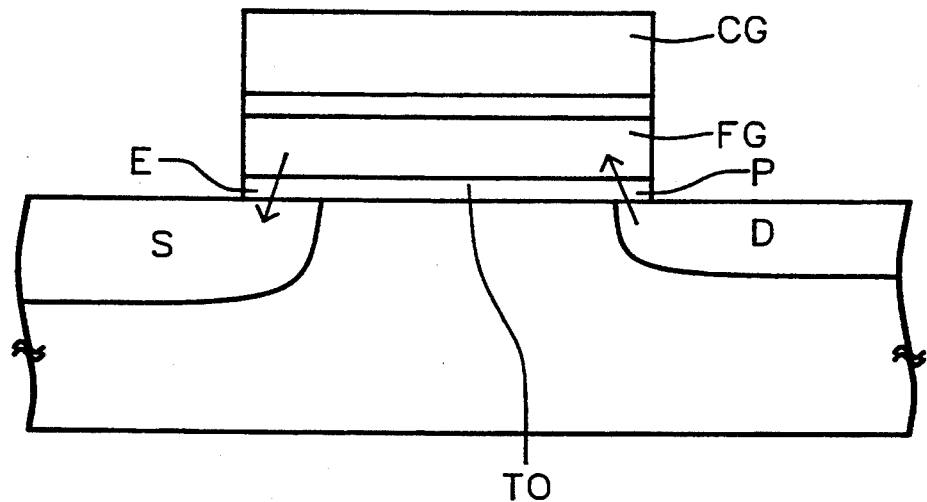
FIG. 2A – Prior Art
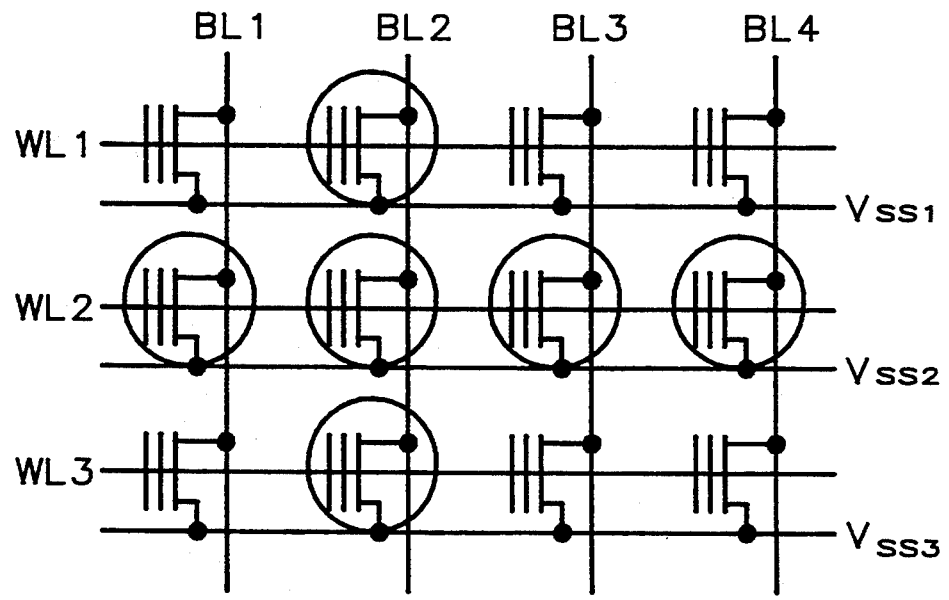
FIG. 2B – Prior Art

METHOD OF MAKING SINGLE BIT ERASE FLASH EEPROM

BACKGROUND OF THE INVENTION

1. Field of the Invention

This invention relates to EEPROM devices and more particularly to bit erasing as well as block erasing therein.

2. Description of Related Art

In the past in EEPROM devices, erasure has been performed groups of eight bits known as a byte, byte by byte, but one cell needs 2 1/8 transistors and tunneling window, so the cell size is large. See FIG. 1B where a cell includes a cell transistor Tc, a bit select transistor $T_{bit}$, and share the byte select transistor $T_{byte}$ with seven other cells.

An alternative to the EEPROM which solves part of the problem of large cell size is the flash EPROM. While the flash EPROM has the advantage that the cell size is small, the problem is that the flash EPROM has the disadvantage that it erases block by block, and one can not use it to erase bit by bit or byte by byte.

FIG. 1A shows a cross section of a prior art device known as a FLOTOX (Floating-Gate Tunneling Oxide) EEPROM cell known as an E²PROM cell which requires a tunnel oxide window and a select transistor, not shown in FIG. 1A, so the cell size is large. The FLOTOX cell is described in Samachisa et al of SEEQ Technology Inc. and U of C, Berkeley for "A 128k Flash EEPROM Using Double-Polysilicon Technology", IEEE J. Solid-State Circuits Vol. 8C-22, No. 5, pp 676–683 (Oct. 1987.) In FIG. 1A the device includes a P-substrate 10 containing a drain region 11 connected to $V_d$ voltage source, a source region 12 connected to $V_s$ voltage source, a tunnel oxide 14, gate oxide layer 15, a field oxide (FOX) 16, a floating gate 17 composed of polysilicon 1 first dielectric layer 18, a control gate 19 composed of polysilicon 2 connected to $V_g$ voltage source, and a second dielectric layer 20. The tunnel oxide 14 is located between the floating gate 17 and the N+ drain region 12.

FIG. 1B shows a prior art E²PROM cell array (in accordance with FIG. 1A) and shows the connection lines required for its operation. Referring to Table 1 an operation table shows how an E²PROM can program and erase in groups of cells, by the byte (8 bits.)

TABLE 1

|  | PROGRAM | ERASE | READ |
| --- | --- | --- | --- |
| SELECTED WORD LINE | 20 V | 20 V | 5 V |
| UNSELECTED WORD LINE | 0 V | 0 V | 0 V |
| PROGRAM LINE | 17 V | 0 V | 0 V |
| BIT LINE 0 (ERASED) | 0 V | 17 V | 1.6 V |
| BIT LINE 7 (PROGRAMMED) | 0 V | 0 V | 2.0 V |

FIG. 2A shows a prior art flash memory cell structure know as an ETOX ® flash memory comprising a flash memory cell with tunnel oxide TO below the floating gate FG. The device includes source S and drain D in the substrate and a control gate CG above the floating gate FG separated therefrom by a dielectric layer, with the erase E function from floating gate FG to source indicted and the programing P function from drain to floating gate FG indicated.

FIG. 2B shows a cell array of the prior art device of FIG. 2A. The array is controlled by bit lines BL1, BL2, BL3 and BL4 which extend vertically to the cells. The bit lines are connected to the S/D circuits of the cells, which are connected at the opposite ends to one of a plurality of voltage supply sources represented by $V_{ss1}$, $V_{ss2}$, and $V_{ss3}$. Word lines WL1, WL2, and WL3 are the horizontally directed lines connected to the cells. In particular, the word lines WL1, WL2, and WL3 are connected to the control gates of the cells. FIG. 2B along with TABLE 2 which is a flash memory operation table shows how such an ETOX flash memory device operates. In particular, Table 2 below shows the operation table for the ETOX flash memory of FIGS. 2A and 2B is unable to program and erase by byte (8 bits.) Referring to Table 2, one can program or read a single bit (cell,) but one can not erase a single bit, because the word lines WL1, WL2, . . . WLn and $V_{ss1}$, $V_{ss2}$. . . $V_{ssn}$ lines are parallel with each other (i.e. are oriented in the same direction.)

TABLE 2

|  | PROGRAM | ERASE | READ |
| --- | --- | --- | --- |
| SELECTED WORD LINE (WL2) | 12 V | 0 V | 5 V |
| UNSELECTED WORD LINE (WL1, WL3) | 0 V | 0 V | 0 V |
| SELECTED BIT LINE (2) | 7 V | 0 V | 1.6 V |
| UNSELECTED BIT LINE 1, 3, 4 | 0 V | 0 V | 0 V |
| SELECTED $V_{ss}$ (2) | 0 V | 12 V | 0 V |
| UNSELECTED $V_{ss}$ (1, 3) | 0 V | 0 V | 0 V |

SUMMARY OF THE INVENTION

An object of this invention is an EEPROM which has the flexibility that it can be erased bit by bit, byte by byte, or block by block as required by the user.

An advantage of this invention is that it adds a select gate which allows a bit erase function as well as a block erase function in an EEPROM device of minimal size. In contrast, while the FLOTOX device allows a bit erase, the cell size is very large. An ETOX flash memory device cannot provide a single bit erase.

Another advantage of this invention is that two transistors are formed by self-aligned technology so the cell size is small, and very close to the flash EPROM in size.

BRIEF DESCRIPTION OF THE DRAWINGS

The foregoing and other aspects and advantages of this invention are explained and described below with reference to the accompanying drawings, in which:

FIG. 1A shows a cross section of a prior art device known as a FLOTOX (Floating-Gate Tunneling Oxide) EEPROM cell known as an E²PROM cell.

FIG. 1B shows a prior art E²PROM cell array (in accordance with FIG. 1A) and shows the connection lines required for its operation.

FIG. 2A shows a prior art flash memory cell structure.

FIG. 2B shows a cell array of the prior art device of FIG. 2A.

FIGS. 4A and 4B are cross sectional views of a device in accordance with this invention taken along line 4A—4A in FIG. 4C.

FIG. 4C is a plan view of the device 29 of FIGS. 4A and 4B.

In FIG. 5, the device of FIG. 4B is shown after several additional layers including a sandwich of dielectric layers above and below the control gate layer to be formed into two adjacent EPROM devices have been applied and partially processed.

FIG. 6 shows the product of FIG. 5 after the four layers to be patterned into the floating and control gates have been etched.

FIG. 7 shows the product of FIG. 6 after a source/drain (S/D) implant mask has been applied, exposed to a pattern, and developed into segments of mask which are spaced away form the stacks providing openings outboard from the stacks for implantation of S/D more heavily doped N+ regions.

FIG. 8 shows the results of process steps which comprise formation by CVD of a blanket silicon dioxide spacer layer which was then etched back in a conventional spacer etchback process with spacers formed adjacent to the stacks of FIG. 7.

FIG. 9 (which is a section along line 9—9 in FIG. 10) shows the device 29 of FIG. 3B which has been produced by the process of this invention.

FIG. 11 shows a sectional view taken along line 11—11 in FIG. 10 showing the select gate lines patterned as described with reference to FIG. 9 and the floating gates and a transverse control gates located in a stack beneath the select gate lines.

FIG. 12 shows a sectional view taken along line 12—12 in FIG. 10 shows the "select gate" lines above the combine silicon dioxide layers above the substrate.

FIG. 13 shows a sectional view in the bit line direction taken along line 13—13 in FIG. 10 shows the "select gate" lines above the silicon dioxide layers above an N+ region bit lines in the surface of the substrate 40.

DESCRIPTION OF THE PREFERRED EMBODIMENT

Figure 3A:
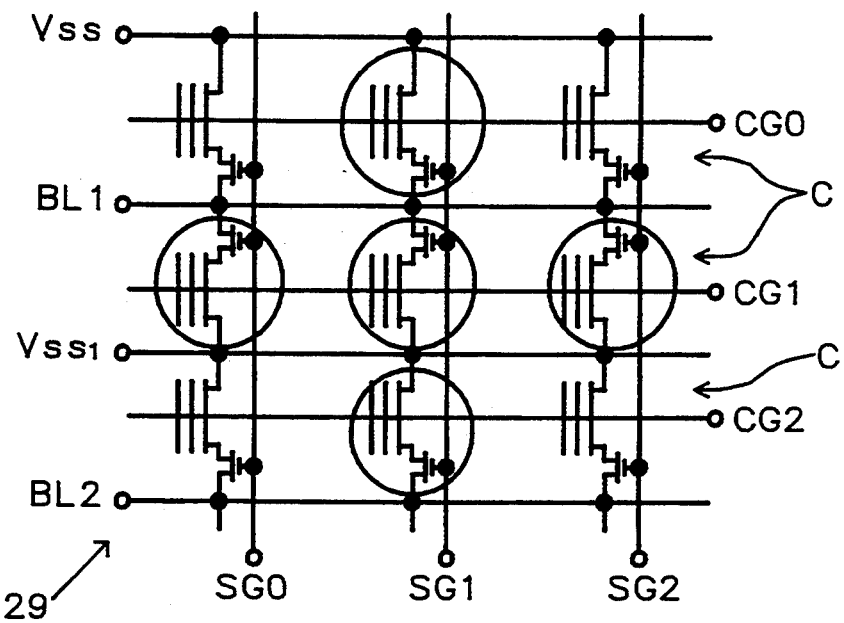
FIG. 3A shows a schematic circuit diagram of an EEPROM circuit including devices in accordance with this invention.
Figure 3B:
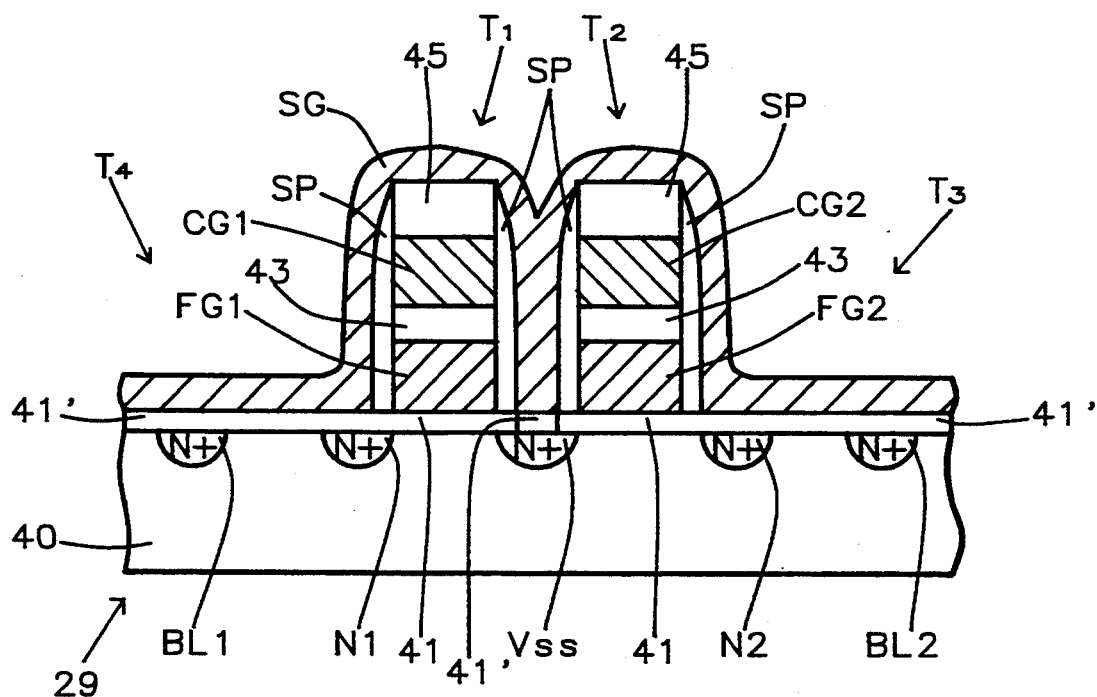
FIG. 3B shows a cross sectional view of an embodiment of a device of the kind used in FIG. 3A.

FIGS. 3A and 3B show an EEPROM device made in accordance with this invention.

FIG. 3A shows a schematic circuit diagram of an EEPROM circuit including devices in accordance with this invention. There are three representative control gate lines CG0, CG1, and CG2, two representative bit lines BL1 and BL2, three representative select gate lines SG0, SG1, and SG2 and two voltage lines Vss0 and Vss1 which are connected in the circuit of FIG. 3A to the nine representative cells "C" of a larger array, which are shown.

In each cell the source electrodes of the flash portions of each cell are connected to $V_{ss}0$ or $V_{ss}1$ and the drains thereof are connected one of an equal number of simple FET devices associated therewith. Each of those simple FET devices has its gates connected to the select gate lines SG0, SG1, and SG2. Each FET device has its S/D circuit connected at one end to a bit line such as bit line BL1 or BL2 and at the other end to the S/D (source/drain) circuits of the flash portions of each cell. The control gates of the cells are connected with each horizontal array to one of the control gate lines CG0, CG1, and CG2. Between the control gates and the S/D regions of the flash portions of each cell are the floating gates.

FIG. 3B shows a cross sectional view of an embodiment of a device 29 of the kind used in FIG. 3A, with the P-silicon semiconductor substrate 32 having regions therein comprising N+ buried bit lines BL1 and BL2, N+ nodes N1 and N2, plus Vss N+ line. Above the entire substrate 32 including the N+ regions is a blanket silicon dioxide layer 30 thereon The node N1 region and the region $V_{ss}$ (connected to the $V_{ss}$ line) form the source and drain for the polysilicon 1 floating gate FG1 upon which dielectric layer 43 is stacked. Polysilicon 2 control gate CG1, dielectric layer 45, spacer layer cap SP, and spacers SP on the side of the stack. Node N2 region and the $V_{ss}$ region form the source and drain for the floating gate FG2 upon which dielectric layer 43 in a stacked with control gate CG2, dielectric layer 45, spacer layer cap SP, and spacers SP on the side of the stack. Extending to and above the stacks is the select gate polysilicon 3 line SG. Two select transistors are defined by the polysilicon 3 layer SG and the nodes N2 and BL2 and the nodes N1 and BL1 for the two EEPROM transistors T1 and T2.

The cells shown in FIGS. 3A and 3B are programmed in a single bit erase and flash erase EEPROM operation. The cell is programmed by hot carrier, erased by tunneling similar to that in a flash memory device, but single bit erasure on the drain side. A flash erase is provided on the source side. A select gate SG is provided to control the single bit being erased with transistors T3 and T4.

TABLE 3

| | PROGRAM | SINGLE BIT ERASE | FLASH ERASE | READ |
|---|---|---|---|---|
| SELECTED SG (SG$_1$) | 7 V | 12 V | 0 V | 5 V |
| UNSELECTED SG (SG$_0$) | 0 V | 0 V | 0 V | 0 V |
| UNSELECTED SG (SG$_2$) | 0 V | 0 V | 0 V | 0 V |
| SELECTED CG (CG$_1$) | 12 V | 0 V | 0 V | 5 V |
| UNSELECTED CG (CG$_0$) | 0 V | 6 V | 0 V | 0 V |
| UNSELECTED CG (CG$_2$) | 0 V | 0 V | 0 V | 0 V |
| SELECTED BL (BL$_1$) | 7 V | 12 V | 0 V | 1.6 V |
| UNSELECTED BL (BL$_2$) | 0 V | 0 V | 0 V | 0 V |
| SELECTED V$_{ss}$ (V$_{ss}1$) | 0 V | 0 V | 12 V | 0 V |
| UNSELECTED V$_{ss}$ (V$_{ss}0$) | 0 V | 0 V | 0 V | 0 V |

PROCESS

FIGS. 4A, 4B, 4C, 5–9 and 11–13 show the process flow employed to produce the device of FIGS. 3A and 3B in accordance with this invention.

CMOS Well Formation

Figure 4A:
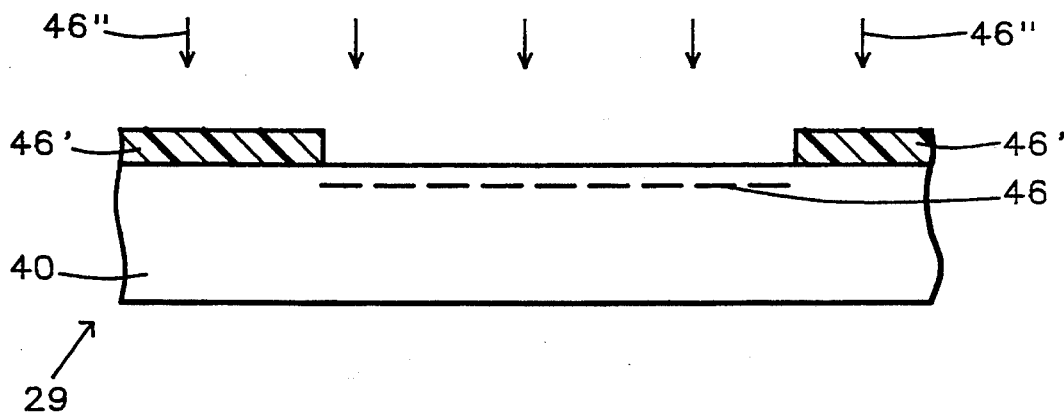
FIGS. 4A, 4B, 4C, 5–9 and 11–13 show the process flow employed to produce the device of FIGS. 3A and 3B in accordance with this invention.
Figure 4B:
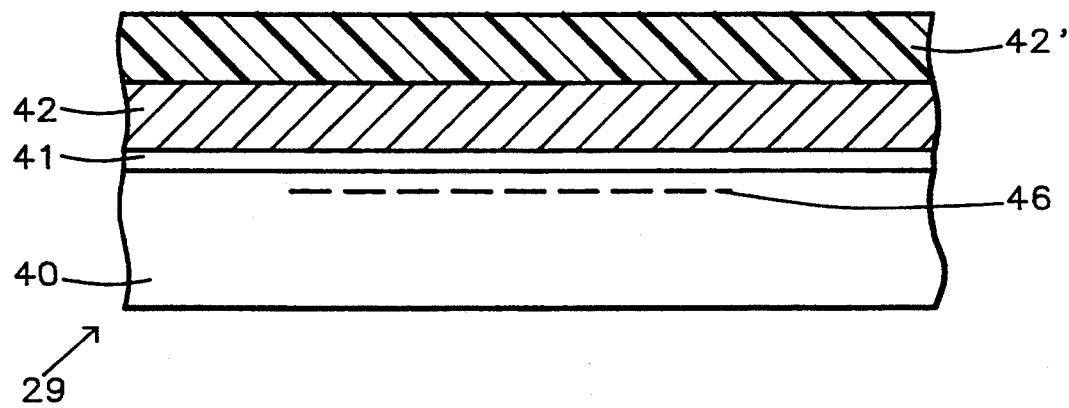
Figure 4C:
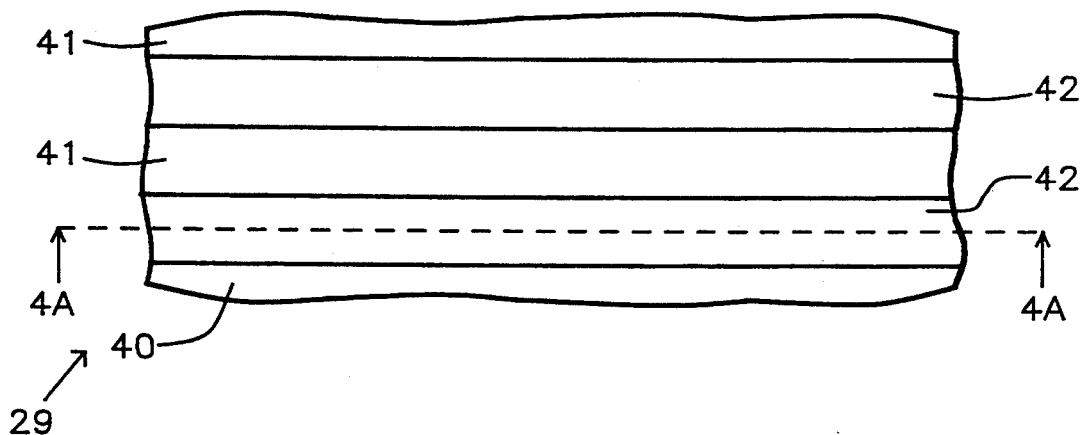

FIGS. 4A and 4B are cross sectional views of a device in accordance with this invention taken along line 4A—4A in FIG. 4C of a device 29 being formed in accordance with the process of this invention, including a semiconductor substrate 40. FIG. 4C is a plan view of the device 29 of FIGS. 4A and 4B.

First the substrate comprising P- doped silicon is subjected to a CMOS isolation process (LOCOS), because the EEPROM cell is formed without a field oxide region.

Second, the cell 29 is implanted through an EPROM $V_T$ mask 46' with ions 46" preferably comprising P-boron implanted into silicon substrate 40 forming P-doped region 46 near the surface of substrate 40 of device 29 to enhance the programmability of the cells being formed.

Then, referring to FIG. 4B, an EEPROM tunneling oxide layer 41 is blanket deposited upon the surface of substrate 40. Preferably, tunneling oxide layer 41 has a thickness between about 50Å and about 200Å.

Next, a polysilicon 1 floating gate layer 42 is blanket deposited upon the EEPROM tunneling oxide layer 41. Then layer 41 is masked with mask 42' and patterned by etching through openings in the mask 42' to form transverse bar patterns 42 shown in the plan view shown in FIG. 4C, with the mask 42' removed.

Figure 5:
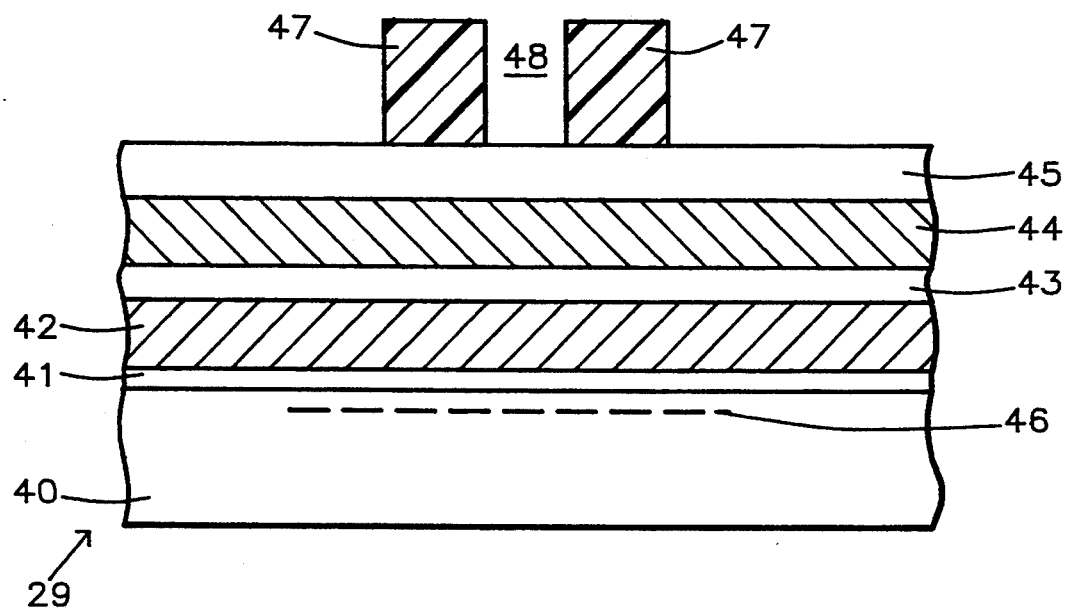

In FIG. 5, the device 29 of FIG. 4B is shown after several additional layers including a sandwich of dielectric layers above and below the control gate layer to be formed into two adjacent EPROM devices have been applied and partially processed.

Initially, a first dielectric, interpolysilicon dielectric layer 43 is blanket deposited over the polysilicon i bar patterns 42 and exposed portions of tunneling oxide layer 41. The interpolysilicon dielectric layer 43 (first dielectric layer) comprises a material such as ONO interpolysilicon or silicon dioxide which is deposited by HTO (high temperature oxidation) or thermal oxidation with a thickness between about 30Å and about 500Å.

Then, a polysilicon 2 control gate layer 44 is deposited in a blanket layer upon the dielectric layer 43. Polysilicon 2 control gate layer 44 is doped in accordance with the standard processing of polysilicon electrodes.

Later, a second dielectric layer comprising a silicon dioxide layer 45 is formed by chemical vapor deposition (CVD/thermal silicon dioxide), with a thickness between about 30Å and about 500Å.

Polysilicon 2 Mask

Next, a blanket photoresist layer 47 of is applied exposed to a pattern and developed to form the photoresist mask 47 with the pattern shown in FIG. 5 with gap 48 between mask strips 47.

Figure 6:
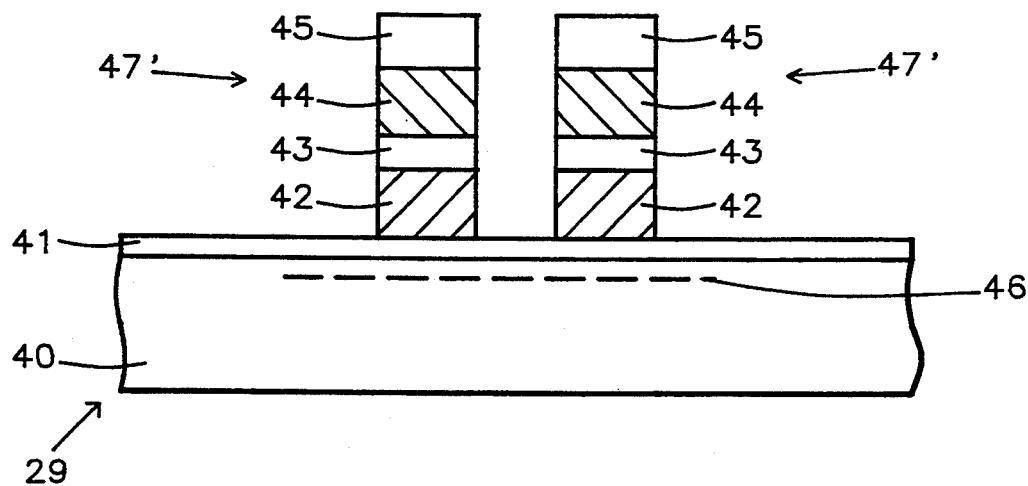

Referring to FIG. 6 the product of FIG. 5 is shown after the four layers to be patterned into the floating and control gates have been etched. The mask 47 has been used in a CVD etching (self-aligned etching (SAE)) of silicon dioxide layer 45, polysilicon 2 control gate layer 44, ONO layer 43 and polysilicon 1 floating gate layer 42 into two parallel stacks 47' (floating gates 42 and control gates 44 and associated dielectric layers 43 and 45) running orthogonally to the strips 42 shown in FIG. 4B including of four layers including polysilicon 1 floating gate layer 42, an interpolysilicon dielectric layer 43, polysilicon 2 control gate layer 44, and a silicon dioxide dielectric layer 45. This process is in accordance with the standard process for EPROM and flash EPROM devices.

Formation of Source/Drain Mask

Figure 7:
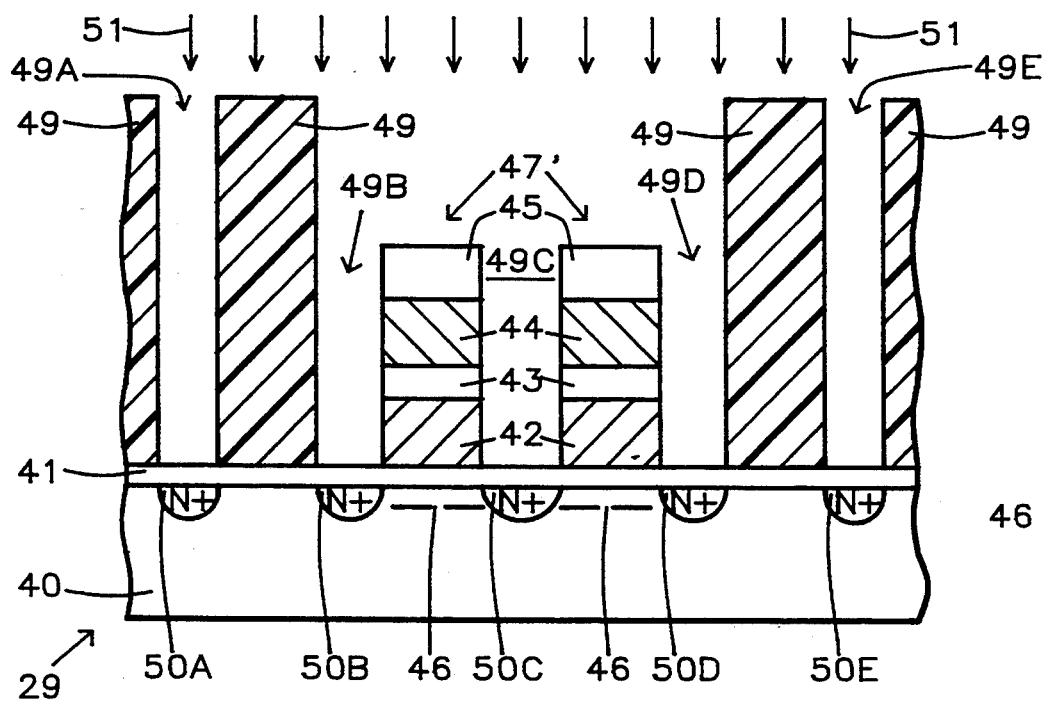

FIG. 7 shows the product of FIG. 6 after the source/-drain (S/D) implant mask 49 has been applied, exposed to a pattern, and developed into segments of mask 49 which is spaced away form the stacks 47' providing openings outboard from the stacks 47'. There are five slots one slot 49C between the stacks 47', two slots 49B and 49D between the mask 49 and stacks 47' and two slots 49A and 49E between the sections of mask 49.

N+ Source/Drain Ion Implant

Then N+ ions 51 (preferably arsenic (As) ions 51) are implanted into N+ regions 50A, 50B, 50C, 50D, and 50E between the segments of mask 49 and the self-aligned patterns provided by the stacks 47'.

Finally the segments of photoresist mask 49 are stripped.

Formation of Spacers

Figure 8:
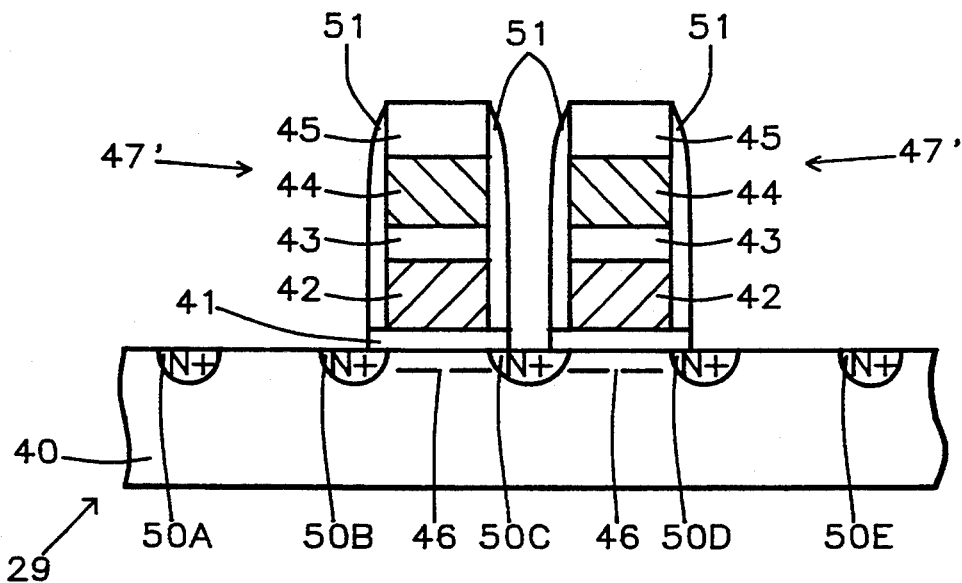

Subsequent to the process shown by FIG. 7, the process steps shown by FIG. 8 comprise formation by CVD of a blanket silicon dioxide spacer layer 51, was then etched back in a conventional spacer etchback process with spacers 51 formed adjacent to the stacks 47'. The spacer etching process also etches away exposed surfaces of tunneling oxide layer 41, leaving the surface of the substrate 40 and N+ regions 50A, 50B, 50D, and 50E (in whole or in part) exposed in those areas not covered by the spacers 51 and the stacks 47'.

Formation of Gate Oxide Layer Over Exposed Substrate

Figure 9:
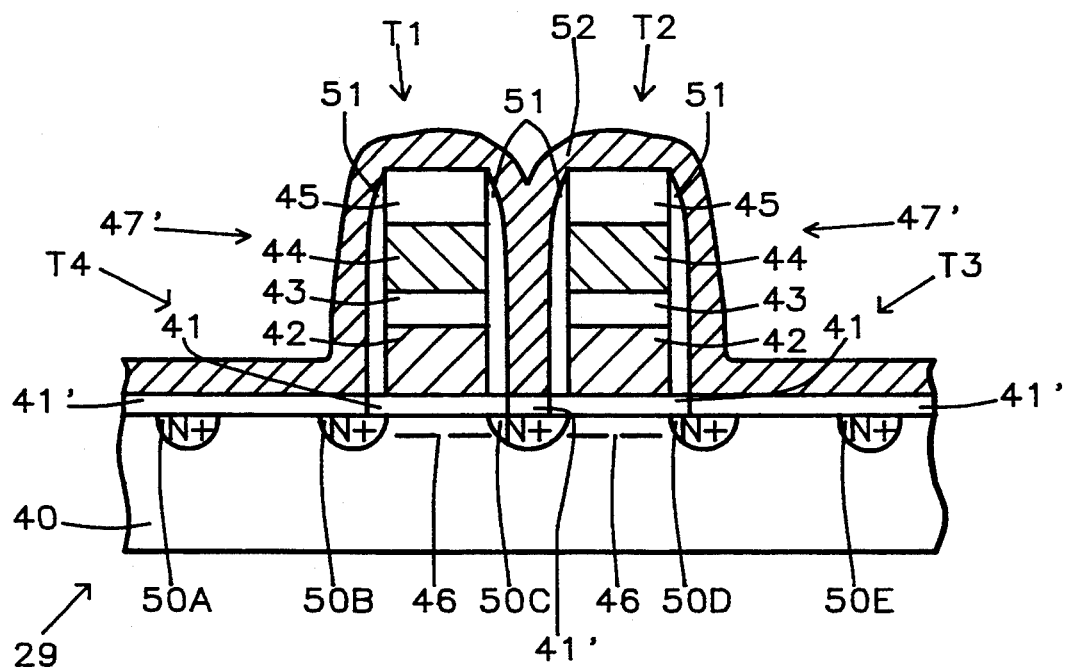

FIG. 9 (which is a section along line 9—9 in FIG. 10) shows the device 29 of FIG. 3B which has been produced by the process of this invention which is completed as described below. In FIG. 9, the product of FIG. 8 is shown with a gate oxide layer 41' formed in the regions where the tunneling oxide layer 41 was removed by the spacer etching, by a conventional gate oxide process.

Formation of Select Gate Layer

A blanket polysilicon 3 select gate layer 52 (shaped into select gates 52', 52" in FIGS. 10-13) is blanket deposited upon the device 29 over the spacer layer 51 and doped in the conventional manner.

Formation of Select Gate Mask

Figure 10:
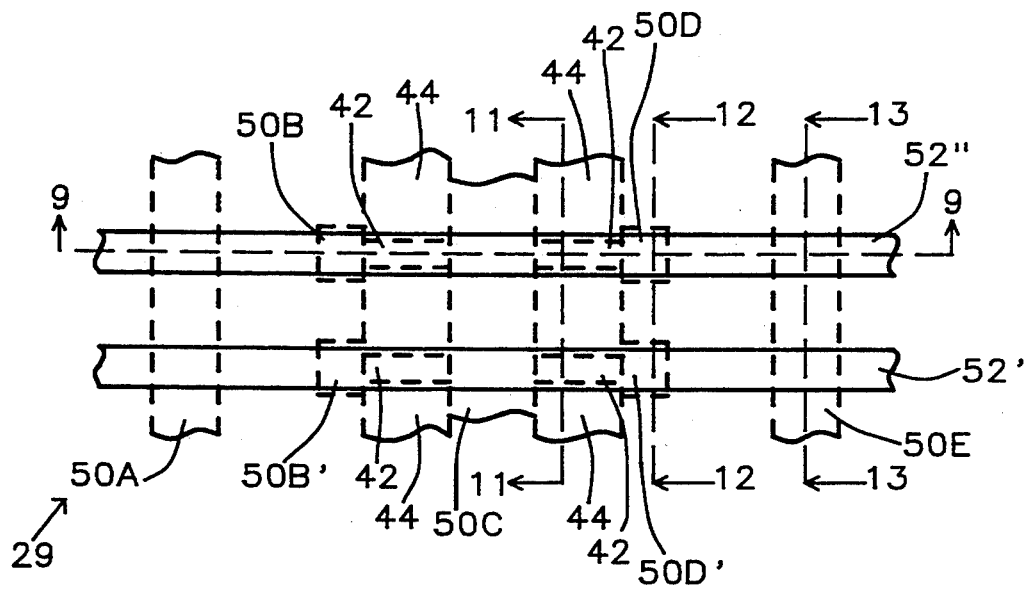
FIG. 10 shows a plan view of a cell of a device in accordance with this invention made by the process of FIGS. 4A, 4B and 5–9 with section lines for FIGS. 9, 11, 12 and 13.

Then, in conventional manner, a photoresist select gate mask 54 (mask 54 seen in FIGS. 11-13) is formed and used to protect desired surfaces during the process of etching the polysilicon 3 select gate layer 52 to form select gates lines 52' and 52", as seen in FIG. 10. Ultimately, the mask 54 is stripped in a fashion well known to those skilled in the art.

FIG. 10 shows a plan view of a cell of device 29 in accordance with this invention made by the process of FIGS. 4A, 4B and 5-9 with section lines for FIGS. 9, 11, 12 and 13. This cell includes no contact, two select transistors which are defined by the polysilicon 3 layer select gate lines 52', 52". Because of these factors the design is very close to the design of an E²PROM transistor. In addition, the cell size is small, which is a key advantage with the ever increasing demand for smaller integrated circuit devices.

In FIG. 10, there are the elements described above including polysilicon 2 control gate layer 44, N+ regions 50B and 50B', cell nodes in the form of N+ regions 50D and 50D', Vss N+ region 50C, polysilicon 1 bars comprising floating gates 42, N+ region buried bit lines and 50A and 50E, and "select gate" polysilicon 3 lines 52' and 52".

Figure 11:
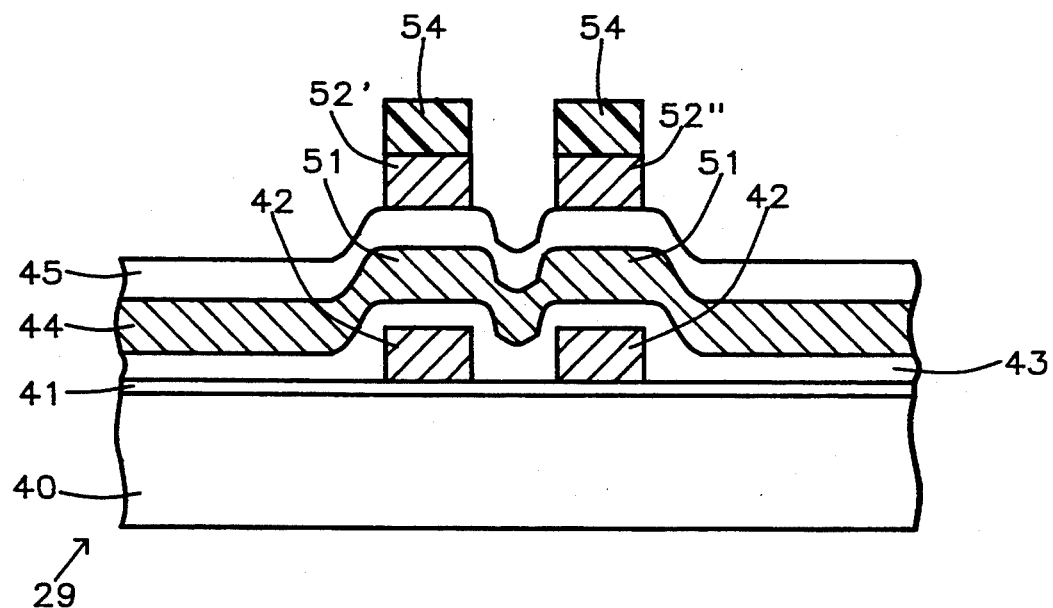

FIG. 11 shows a sectional view taken along line 11—11 in FIG. 10 showing the lines 52', 52" patterned as described with reference to FIG. 9 and the polysilicon 1 floating gates 42 and the control gate 44 located in a stack beneath the polysilicon 3 select gate lines 52', 52". Note that the control gate 44 traverses the two floating gates 42 between the ONO layer 43 and the silicon dioxide second dielectric layer 45.

Figure 12:
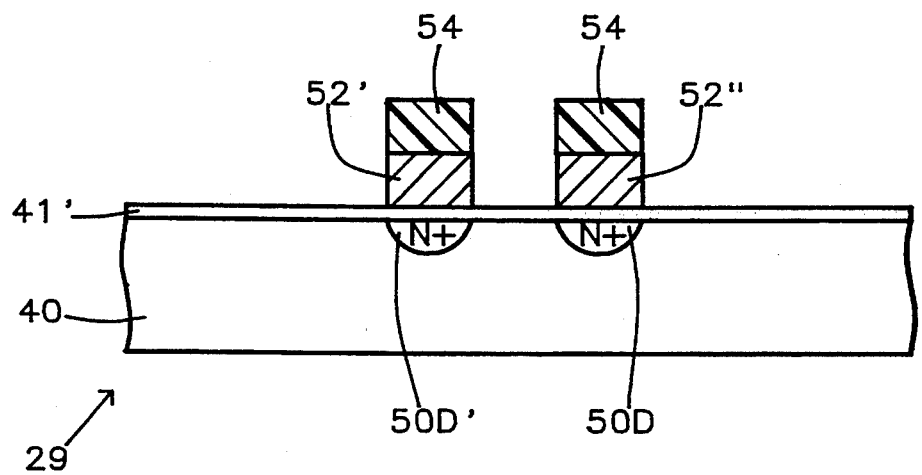

FIG. 12 shows a sectional view taken along line 12—12 in FIG. 10 shows the "select gate" polysilicon 3 lines 52', 52" above the gate oxide layer 41' above the substrate 40. The section is taken through nodes 50D' and 50D.

Figure 13:
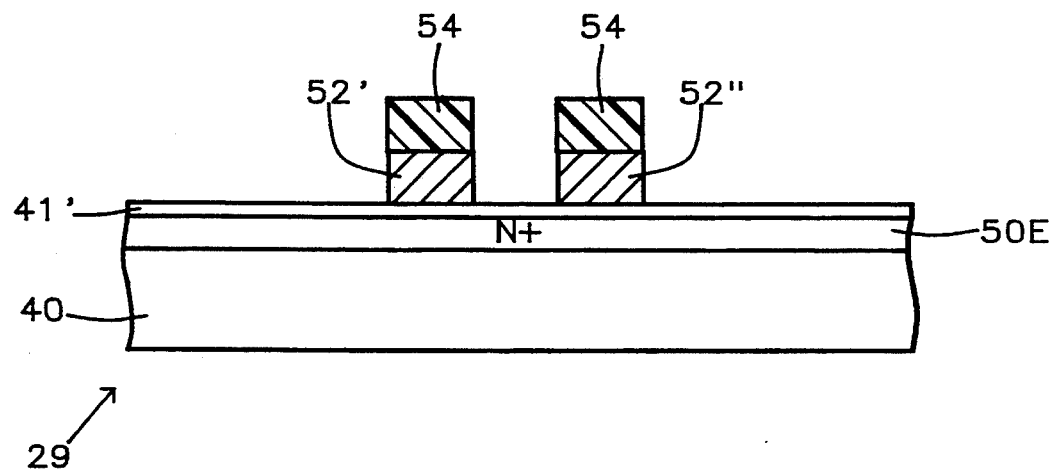

FIG. 13 shows a sectional view in the bit line direction taken along line 13—13 in FIG. 10 shows the "select gate" polysilicon 3 lines 52', 52" above the gate oxide layer 41' above an N+ region bit lines 50E in the surface of the substrate 40.

Polycide Gate Electrodes

As a substitute for the three polysilicon layers used to form the gate electrodes, a polycide material can be used instead. Polycides are a combination of polysilicon and silicides. A typical polycide has a lower level of polysilicon with an upper level of silicide. They have the positive features of both layers with good stability, adherence, and coverage (from the polysilicion) and a high conductivity path from the silicide.

The polycide comprises a material selected from the group consisting of $WSi_2$, $TiSi_2$, $CoSi_2$, $MoSi_2$, and $TaSi_2$.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacture of an EEPROM device on a semiconductor substrate comprising:
   forming a tunnel oxide layer over said substrate,
   forming a floating gate layer above said tunnel oxide layer,
   forming a first dielectric layer over said floating gate layer,
   forming a control gate layer over said first dielectric layer,
   forming a second dielectric layer over said control gate layer,
   patterning a pair of stacks of said floating gate layer, said first dielectric layer, said control gate layer and said second dielectric layer,
   forming a doping mask for source/drain regions on said substrate,
   ion implanting an array of five source/drain regions including three source drain regions at the base of said stacks to form two EEPROM transistors and two source/drain regions of a select transistor spaced laterally from said stacks,
   forming dielectric spacer structures covering the sides of said stacks,
   forming a select gate layer covering said dielectric spacer structures and the substrate, and
   forming select transistor gate electrodes extending over said dielectric spacer structures by patterning said select gate layer wherein said source/drain regions of the select transistor are spaced laterally from said stacks and said dielectric spacer structures.

2. A method in accordance with claim 1 wherein said tunnel oxide layer has a thickness within the range between about 50Å and about 200Å.

3. A method in accordance with claim 2 wherein said first dielectric layer above said floating gates comprises an ONO layer with an effective thickness within the range between about 30Å and about 500.

4. A method in accordance with claim 3 wherein said second dielectric layer above said control gate layer comprises an CVD/thermal oxide with a thickness within the range between about 30Å and about 500Å.

5. A method in accordance with claim 1 wherein said first dielectric layer comprises an ONO layer with a thickness within the range between about 30Å and about 500Å.

6. A method in accordance with claim 5 wherein said second dielectric layer comprises an CVD/thermal oxide with a thickness within the range between about 30Å and about 500Å.

7. A method in accordance with claim 6 wherein said spacer layer comprises silicon dioxide formed by a CVD process.

8. A method in accordance with claim 1 wherein said floating gate layer, said control gate layer and said select gate layer each comprises a material selected from polysilicon and a polycide.

9. A method in accordance with claim 8 wherein said polycide comprises a material selected from the group consisting of $WSi_2$, $TiSi_2$, $CoSi_2$, $MoSi_2$, and $TaSi_2$.

10. A method in accordance with claim 7 wherein said floating gate layer, said control gate layer and select gate layer each comprises a material selected from polysilicon and a polycide.

11. A method in accordance with claim 10 wherein said polycide comprises a material selected from the group consisting of $WSi_2$, $TiSi_2$, $CoSi_2$, $MoSi_2$, and $TaSi_2$.

12. A method in accordance with claim 1 wherein prior to formation of said first dielectric layer, said first floating gate layer is patterned by etching into transverse bar patterns.

13. A method of manufacture of an EEPROM device on a semiconductor substrate comprising:
   forming a tunnel oxide layer over said substrate,
   forming a floating gate layer comprising a material selected from polysilicon and a polycide above said tunneling oxide layer,
   masking said first floating gate layer in the pattern of transverse bars by etching into transverse bar patterns,
   forming an interconductor, first dielectric layer over said floating gate layer,
   forming a control gate layer comprising a material selected from polysilicon and a polycide over said first dielectric layer,
   forming a second dielectric layer over said control gate layer,
   patterning a pair of stacks of said floating gate layer, said first dielectric layer, said control gate layer and said second dielectric layer, forming a doping mask for source/drain regions on said substrate, ion implanting an array of five source/drain regions including three source/drain regions at the base of said stacks to form two EEPROM transistors and two source/drain region of a select transistor spaced laterally form said stacks, forming a blanket dielectric spacer layer over said stacks, source/drain regions, and the substrate etching said dielectric spacer layer to form spacers covering the sides of said stacks, while etching away exposed portions of said tunnel oxide exposing portions of said substrate, forming a gate oxide layer over said exposed portion of said substrate, forming a select gate layer comprising a polysilicon layer or a polycide layer extending over said gate oxide layer and said spacers, and forming select transistor gate electrodes extending over said gate layer and spacers by patterning the select gate layer wherein said source/drain regions of the select transistor are laterally spaced from said stacks and spacers.

14. A method in accordance with claim 13 wherein said polycide comprises a material selected from the group consisting of $WSi_2$, $TiSi_2$, $CoSi_2$, $MoSi_2$, and $TaSi_2$.

15. A method in accordance with claim 13 wherein said interconductor, first dielectric layer comprises an ONO layer with an effective thickness within the range between about 30Å and about 500Å.

16. A method in accordance with claim 13 wherein said second dielectric layer comprises CVD/thermal oxide with a thickness within the range between about 30Å and about 500Å.

17. A method in accordance with claim 14 wherein said interconductor, first dielectric layer comprises an ONO layer with an effective thickness within the range between about 30Å and about 500Å.

18. A method in accordance with claim 15 wherein said second dielectric layer comprises CVD/thermal oxide with a thickness within the range between about 30Å and about 500Å.

19. A method in accordance with claim 16 wherein said polycide comprises a material selected from the group consisting of $WSi_2$, $TiSi_2$, $CoSi_2$, $MoSi_2$, and $TaSi_2$.

20. A method in accordance with claim 13 wherein said tunneling oxide layer has a thickness within the range between about 50Å and about 200Å.

21. A method in accordance with claim 14 wherein said tunneling oxide layer has a thickness within the range between about 50Å and about 200Å.

22. A method in accordance with claim 15 wherein said tunneling oxide layer has a thickness within the range between about 50Å and about 200Å.

23. A method in accordance with claim 16 wherein said tunneling oxide layer has a thickness within the range between about 50Å and about 200Å.

24. A method in accordance with claim 17 wherein said tunneling oxide layer has a thickness within the range between about 50Å and about 200Å.

* * * * *